(12) United States Patent
Konz

(10) Patent No.: US 9,066,415 B2
(45) Date of Patent: Jun. 23, 2015

(54) DEVICE FOR ABSORPTION OF NOISE

(75) Inventor: Oliver Konz, Ilshofen (DE)

(73) Assignee: Würth Elektronik eiSos GmbH & Co. KG, Waldenburg (DE)

( * ) Notice: Subject to any disclaimer, the term of this patent is extended or adjusted under 35 U.S.C. 154(b) by 0 days.

(21) Appl. No.: 13/878,253

(22) PCT Filed: Oct. 13, 2011

(86) PCT No.: PCT/EP2011/067886
§ 371 (c)(1),
(2), (4) Date: Apr. 8, 2013

(87) PCT Pub. No.: WO2012/052351
PCT Pub. Date: Apr. 26, 2012

(65) Prior Publication Data
US 2013/0192888 A1      Aug. 1, 2013

(30) Foreign Application Priority Data
Oct. 21, 2010   (DE) .......................... 10 2010 042 743

(51) Int. Cl.
| | |
|---|---|
| H01R 4/56 | (2006.01) |
| H05K 9/00 | (2006.01) |
| H01F 17/06 | (2006.01) |
| H01F 27/33 | (2006.01) |
| H04B 15/00 | (2006.01) |
| H04B 15/02 | (2006.01) |
| H05K 5/00 | (2006.01) |

(52) U.S. Cl.
CPC ............ *H05K 9/0007* (2013.01); *H05K 9/0066* (2013.01); *H01F 17/06* (2013.01); *H01F 27/33* (2013.01); *H01F 2017/065* (2013.01); *H04B 15/00* (2013.01); *H04B 15/02* (2013.01); *H05K 5/0013* (2013.01); *H05K 9/00* (2013.01)

(58) Field of Classification Search
CPC ........................... H05K 9/0007; H05K 9/0066
USPC ...................... 336/92; 174/372, 375
See application file for complete search history.

(56) References Cited

U.S. PATENT DOCUMENTS

| | | | | |
|---|---|---|---|---|
| 4,873,505 A | * | 10/1989 | Matsui | 336/92 |
| 4,885,559 A | * | 12/1989 | Nakano | 336/92 |
| 6,078,241 A | | 6/2000 | Watanabe et al. | |
| 6,400,248 B1 | | 6/2002 | Konz | |
| 6,515,230 B1 | | 2/2003 | Hirakawa et al. | |
| 2007/0099503 A1 | | 5/2007 | Konz | |
| 2007/0120635 A1 | | 5/2007 | Kobayashi et al. | |

FOREIGN PATENT DOCUMENTS

| | | |
|---|---|---|
| JP | 2002050738 A | 2/2002 |
| JP | 2006024693 A | 1/2006 |
| JP | 2006147796 A | 6/2006 |
| JP | 2010070035 A | 4/2010 |

* cited by examiner

*Primary Examiner* — Hung V Ngo
(74) *Attorney, Agent, or Firm* — Boyle Fredrickson, S.C.

(57) ABSTRACT

A device for absorption of electrical noise on lines contains a housing which is formed from two half-shells, which are connected to one another with the aid of a film hinge and, in the area of their opposite edges, have a locking device, which locks the two half-shells. A ferrite element is held in each half-shell. An aperture or a window is formed in the wall of one half-shell, through which the locking device can be seen, which locking device acts per se in a depression within the wall. Through this aperture it is possible to check and to inspect whether two elements which form the locking device are correctly seated.

10 Claims, 3 Drawing Sheets

Figure 9:
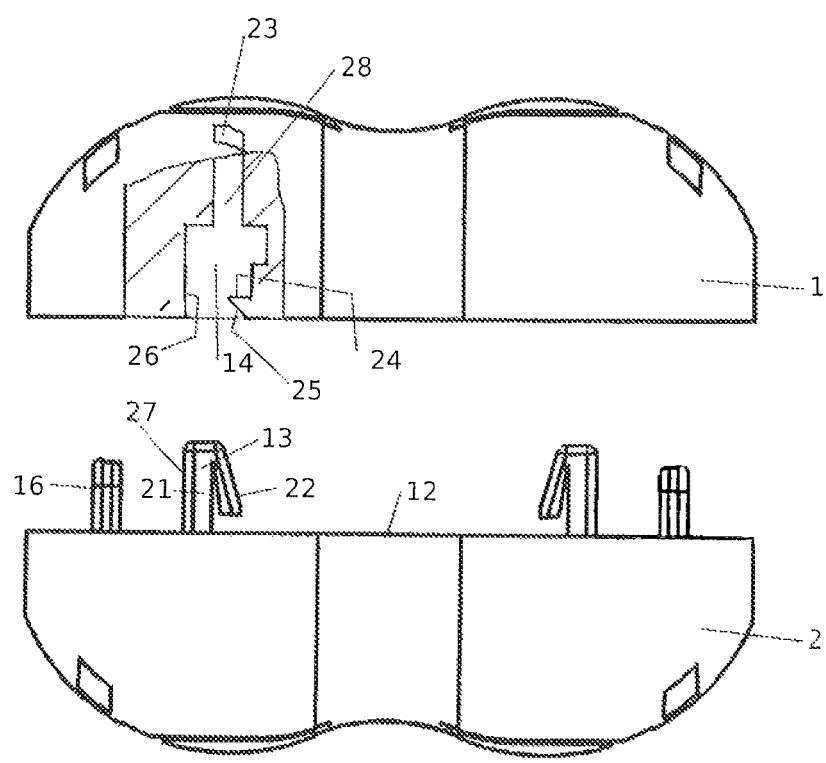

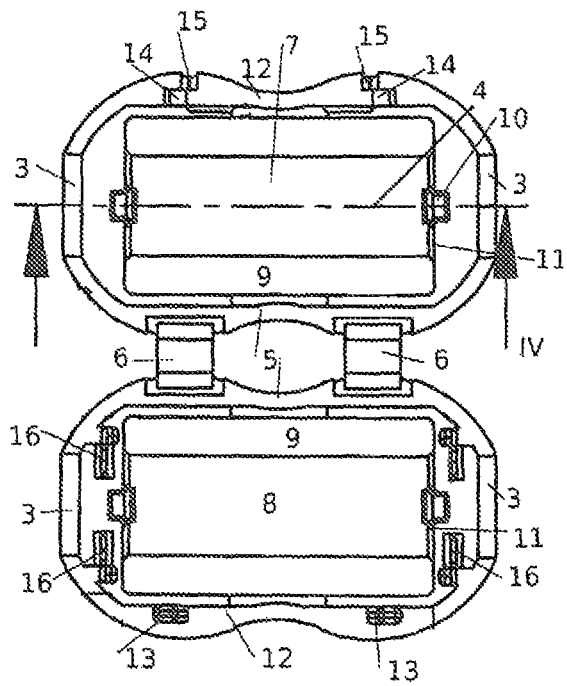
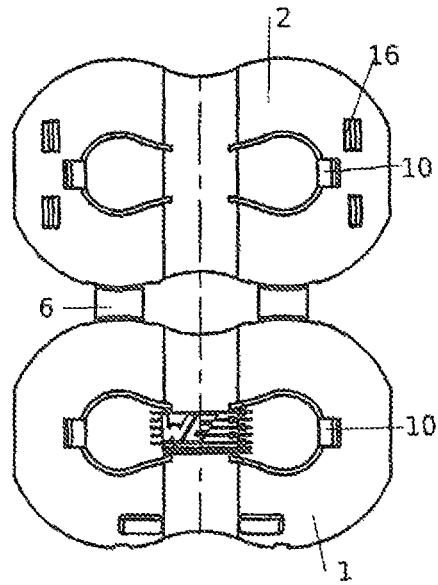
Fig. 1
Fig. 2
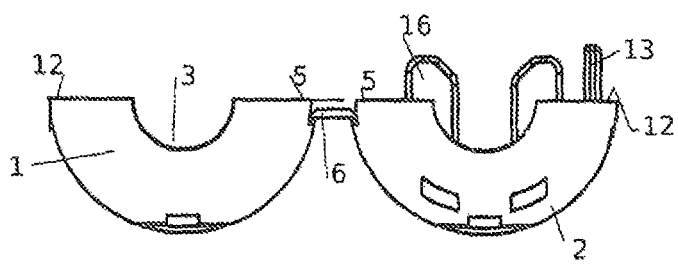
Fig. 3
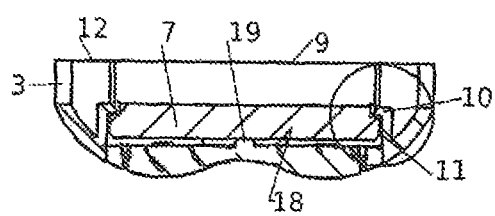
Fig. 4
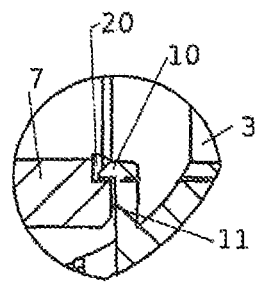
Fig. 5

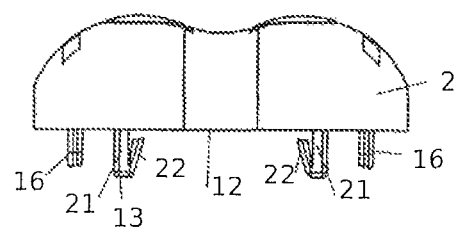
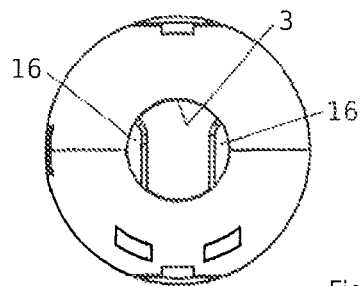
Fig. 6
Fig. 10
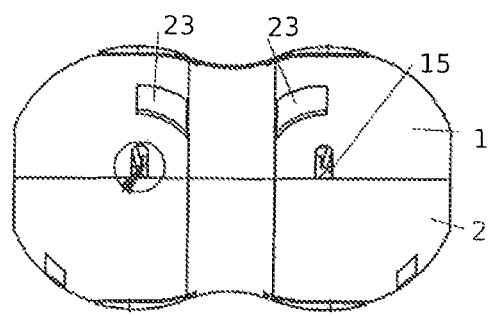
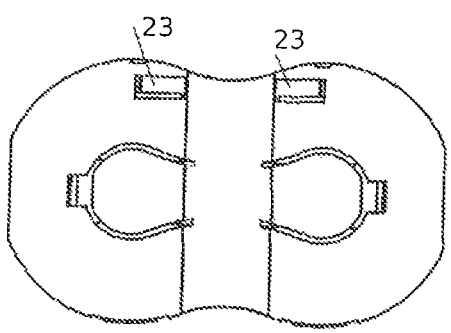
Fig. 7
Fig. 11
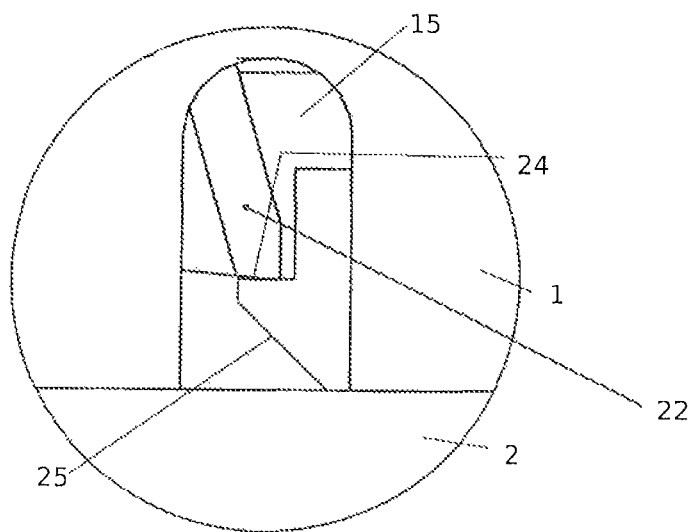
Fig. 8

DEVICE FOR ABSORPTION OF NOISE

The invention relates to a device for absorption of electrical noise on lines.

It is known that high-frequency interferences are transmitted on electrical lines which can lead to interferences of the operation of electronic devices. Said high-frequency, irregular interferences are referred to as noise.

It is also known that it is possible to arrange rings made of magnetic or similarly acting material, in particular ferrites, around the lines, which are capable of absorbing said electrical interferences. In this case, depending on the frequency range, there are closed rings for subsequent mounting made up of two parts that are then arranged around the cable and applied in the direction to one another such that their surfaces facing one another contact without a gap. There are spring-loaded applications to prevent air gaps. There are also cases, in particular with higher frequencies, where a predefined air gap is to be present between the two parts. Also in this case the two ferrite elements are applied in a direction to one another in order to be capable of maintaining the air gap at the predefined level. The ferrite elements are located in housing shells, wherein two half-shells are used for practical reasons.

In the case of a known device of said type, short webs are integrally formed with the half-shells the ferrites are located in, which webs are located between the two end faces of the ferrites oriented to one another and thereby define the thickness of an air gap (DE 10326685) when assembling the two half-shells for formation of the closed housing. In order that after attaching such an absorber the same cannot be detached from the cable, a locking device is provided which when the housing is closed, is arranged in a side wall of a half-shell and which is not visible from the exterior.

In another device of said type (EP 981856), the locking device is also arranged in a recess of the wall of a half-shell and is not visible from the exterior. There is a special tool which can re-open the lock.

It turned out that when attaching such a device, it cannot be ensured in any case that the locking device is completely engaged, so that there is a risk not to obtain sufficient results in terms of absorption of noise. However, this reduced performance is only detected during use.

The object underlying the present invention is to provide an option for checking the correct state of locking immediately after the locking procedure.

In order to achieve this object, the invention proposes a device for absorption of electrical noise having the features named in claim 1. Further embodiments of the invention are the subject-matter of dependent claims.

Thus, the device proposed by the invention comprises a locking device, which in the closed state is completely arranged in a side wall of a half-shell or of both half-shells. No part of the locking device protrudes outwards beyond the outer surface of the housing. Thus, during mounting to the electronic device to be protected against electronic noise or during unwary handling the case cannot occur that the locking device is detached as a result thereof. By means of the aperture located in the wall, which can also be referred to as window, it is possible to optically check the two parts of the locking device mutually acting together. In particular, it becomes possible to automatically perform this check by a camera comparing a picture inside the aperture to a target picture. This way, it is possible to check whether the locking device is engaged and thus whether the device is protected immediately after attaching such an absorber to the line in the electronic device or to the line leading to the electronic device. It is no longer required to put the device into operation.

In a further embodiment of the invention, it can be provided that the locking device is configured such that it is actuated by means of the closing procedure when closing the housing. For example, this can be achieved in that a locking element is initially deformed, when encountering a counter element, until it engages after overcoming a threshold. If it is formed in the type of a barbed hook, an opening without tools is excluded in this case.

For example, in a further embodiment of the invention it can be provided that the locking device comprises a snap protrusion arranged on a longitudinal edge of a housing half-shell and a snap shoulder arranged on the other housing half-shell behind which the snap protrusion or a part of the snap protrusion can engage in the closed state of the housing. This position of the snap protrusion differs from the not snapped-in position of the snap protrusion in an optically perceivable manner, so that also a camera can detect said difference.

In yet another further embodiment of the invention, it can be provided that the snap shoulder, namely the part behind which the snap protrusion engages, is arranged in a depression of the wall of the housing half-shell. Said depression ends into the longitudinal edge of the half-shell which in the closed state of the housing rests on a longitudinal edge of the other half-shell.

The recess can be open towards the inner side of the housing, where necessary. To the outer side of the housing, it is opened by means of the aperture, wherein the aperture can be smaller than the recess per se.

In a further development, the depression can be configured such that it forms a guidance for the snap protrusion configured at the opposite longitudinal edge of the other housing half-shell.

In yet another embodiment of the invention, for insertion of a tool, the housing of the device can comprise an opening ending in the surface of one of the half-shells by means of which tool the locking device can be disengaged. Thus, the opening is in communication with the recess in which the snap shoulder is arranged.

Since, depending on the application case, the ferrites located in the housing half-shells can have a considerable length and shall either abut one another over their entire length or have to comprise a constant air gap over the entire length, according to the invention it can be provided that a locking device is operative at two or more points having a distance in the longitudinal direction of the housing, for example in that on two points in each case one snap protrusion and one snap shoulder is configured. In this case, the aperture is present on both points in order to also be able to check the correct locking on both points.

For assembling two half-shells to form a housing and for uniting the ferrite elements, it can be provided that the two half-shells are produced separately and comprise in each case one locking device in the region of both longitudinal edges. However, according to the invention, in a further embodiment it can preferably be provided that the two housing half-shells are connected to one another on one of their longitudinal edges by means of a film hinge or integral hinge. The locking device is then located on the respective other longitudinal edge of the housing.

To facilitate the attachment, it can be provided that a fixing device for fixing the housing half-shell to the cable is arranged on a housing half-shell at least in the region of one of the axial ends, i.e. the point where the cable enters the housing. Said fixing device can comprise two parallel webs, for example, which have a distance therebetween which is slightly smaller than the diameter of the provided cable. This way, the device proposed by the invention can be fixed to the cable at the desired location even in the open state so that it can subsequently be closed and locked.

For further simplification of the handling, it can be provided that each half-shell comprises a device for fixing of a sanitary element in the respective half-shell. Said device can be an integrally-formed, resilient tongue which engages in a recess in the region of the end face edge of each ferrite element. Said fixing device simplifies the attaching of the device to the cable.

Further features, details and advantages of the invention arise from the claims and the abstract, the wording of both of which is incorporated in the content of the description by reference, the following description of preferred embodiments of the invention as well as the drawings. The figures show in:

FIG. 1 a plan view of the opened device;

FIG. 2 in slightly reduced scale a view from the opposite side;

FIG. 3 an end face view of the opened device from the left in FIG. 1;

FIG. 4 a longitudinal section through a half-shell approximately along the line IV to IV in FIG. 1;

FIG. 5 a detail from FIG. 4 in enlarged scale;

FIG. 6 a side view of the device in a direction from below in FIG. 1;

FIG. 7 a side view of the closed device;

FIG. 8 a detail from FIG. 7 in enlarged scale;

FIG. 9 in enlarged scale the cooperation of the locking device on the longitudinal edges of two half-shells;

FIG. 10 an end face view of the closed device;

FIG. 11 a plan view of the closed device.

In FIG. 1, the two half-shells 1, 2 are shown from the inner side thereof. Then, in the closed position, the visible edges rest one on the other in order to form a gap-free housing. In the region of the two face ends, each half-shell 1, 2 comprises in each case one semicircular recess 3, which in the closed state are congruent to one another and form an almost circular opening. A connection line 4 between the recesses 3 of a half-shell 1, 2 forms a longitudinal direction of the half-shell 1, and thus also of the housing. In the region of the longitudinal edge 5, the two half-shells 1, 2 are connected to one another by means of a foil hinge/integral hinge 6.

In each half-shell, a ferrite element 7 is located, which has the shape of a trough/channel with a groove 8 running in the longitudinal direction and two partition faces 9 running in a common plane. Upon closing of two half-shells 1, 2, the partition faces 9 of the ferrite elements 7 abut one another.

The ferrite elements 7 are held in the respective half-shell 1, 2 by means of two resilient tongues 10, which engage in notches on the respective end faces 11 of the ferrite elements 7.

On the longitudinal edges 12 facing away from the longitudinal edges 5 having the film hinge 6, elements of a locking device are arranged. On the outer longitudinal edge 12 of the lower half shell 2 shown in FIG. 1, two snap protrusions 13 spaced in the longitudinal direction are configured, which protrude beyond the longitudinal edge 12 in FIG. 1 in relation to the drawing plane. On the outer longitudinal edge 13 of the respective other half-shell 1, depressions 14 starting from the longitudinal edge 12 are configured on the corresponding locations, which depressions are open to the interior. Towards the exterior, an aperture 15 is configured for each depression 14, which aperture is offset relative to the depression 14. When closing the two half-shells around the axis formed by the film hinge 6, the snap protrusions 13 get into the depressions 14.

The lower half-shell of FIG. 1, i.e. the half-shells having the snap protrusions 13, comprises webs 16 running perpendicularly relative to the drawing plane outside the end face sides 11 of the ferrite elements 72. Viewed in the longitudinal direction of the half-shell, said webs 16 are arranged between the opening 3 and the end face edge 11 of the respective ferrite element 7. The webs 16 have a distance between their inner edges which is slightly smaller than the diameter of the line for which a specific device is intended.

FIG. 2 shows a view of the arrangement of FIG. 1 from the opposite side in a slightly reduced scale. One can see from the outer side of the half shell 2, in the top of FIG. 2, that the webs 16 are integrally formed there, since the openings for the slider of the tool in which the half-shell is injection-molded are visible. The openings for the resilient tongues 10 are also visible.

FIG. 3 shows the assembly of FIG. 1 from the left in FIG. 1. The two half-shells 1, 2 are in each case located in one plane with their outer and inner longitudinal edges 12, 5 as well as with their end face edges 17. The half-shell 2 on the right in FIG. 3 comprises the aforementioned webs 16, which by means of their inner edges form a slot between them having parallel side walls. Also visible is one of the two snap protrusions 13 on the outer longitudinal edge 12 of the half-shell 2.

The longitudinal section through the half-shell 1 in FIG. 4 shows that the half-shell 1 comprises an internally plane bottom 18, and a protrusion 19 is integrally formed at the center thereof. The ferrite element 7 rests on said protrusion 19. The two resilient tongues 10 which are molded from the bottom of the half-shell 1, engage in the aforementioned notches in the end face sides 11 of the ferrite element 7. Thereby, the ferrite element 7 is held in the half-shell. The partition face 9 of the ferrite element 7 is in a plane with the longitudinal edge 12 of the half-shell 1.

This engaging of the resilient tongues 10 in a recess 20 of the bottom of the ferrite element 7 is shown in more detail in the sectional view of FIG. 5.

FIG. 6 now shows a side view of the device not yet closed from a longitudinal side, namely in the example shown with the half-shell 2 in the front. The shape of the snap protrusions can be seen therefrom. The snap protrusions contain a shaft 21 which protrudes perpendicularly from the longitudinal edge 12. At the end of the straight shaft 21, a resilient tongue 22 is integrally formed which runs with a acute angle relative to the shaft 21 and which points back to the longitudinal edge 12 of the associated half-shell 2.

The two snap protrusions 13 are configured in a mirror-inverted manner to one another.

Upon folding the two half-shells 1, 2 to close, the device looks as shown in FIG. 7. The aperture 15 already mentioned with reference to FIG. 1 is present on a location of the half shell 1 where the snap protrusions 13 of the half-shell 2 abut. Thus, by means of the aperture 15, the cooperation of the snap protrusions 13 with a counter element in the recess 14 is visible.

Above said aperture, the side wall of the half-shell 1 comprises in each case an opening 23 which runs slightly arcuate due to the rounded-off shape of the half-shell 1.

Now, FIG. 8 shows a detailed view of FIG. 7 in enlarged scale, namely an aperture 15. In said aperture 15, the resilient tongue 22 is visible, which is integrally formed on the snap protrusion 13. The aperture 15 is configured in the half-shell 1 in which the depression 14 for receiving the shaft 21 of the snap protrusion 13 is configured. A shoulder 24 is formed in the depression 14, behind which the face end of the resilient tongue 22 engages, when the locking device is closed. On the opposite side of the snap shoulder 24, a slanted face 25 is formed, which when closing the housing causes the resilient tongue 22 to slide off on this slanted face 25.

FIG. 9 shows in a schematic illustration the cooperation of a snap protrusion 13 and the snap shoulder 24. For this purpose, the two half-shells 1, 2 are shown arranged opposite to one another but at a distance. The half-shell 1 having the depression 14 is shown in a cut away view, wherein the section is set through the depression 14 so that the aperture 15 is not visible in this case. The depression 14 is configured such that it almost corresponds to the shape of the snap protrusion 13. The left limiting wall 26 of the depression 14 is arranged in the same location as the left edge 27 of the shaft 21 of the snap protrusion 13. Thereby, the snap protrusion 13 is guided in the depression 14. During the insertion, the resilient tongue 21 is folded into the direction of the shaft until its face end reaches past the edge between the slanted face 25 and the shoulder 24. Then, the resilient tongue 22 is unfolded again outwards, and the end face thereof abuts the shoulder 24.

Both the correct arrangement of the resilient tongue 22 as shown in FIG. 8 and an incorrect arrangement can be detected through the aperture 15. The tongue 22 moves in the plane of the aperture during its transfer from the not yet performed locking to the correct locking, i.e. from the left to the right. Both cooperating locking faces, namely the shoulder 24 and the face end of the tongue 22, are visible in the aperture 15.

Thus, the course of the resilient tongue 22 as well as the arrangement of the end face thereof are a distinctive mark for correct locking of the locking device. These lines can be detected with the aid of an optical detection device. To that end, the aperture 15 is provided in the outer side of one half-shell 1.

The depression 14 merges into the merely outlined opening 23 via a schematically outlined channel 28, through which opening a tool can be inserted. The channel 28 is aligned flush with the resilient tongue 22. If a force is exerted to the resilient tongue 22 from above in FIG. 8 or FIG. 9, it is pivoted in the direction of the shaft 21 of the snap protrusion 13, so that the snap protrusion 13 can once again be moved out of the depression 14 past the shoulder 24.

FIG. 10 shows a front view of the device in closed state. In this case, the assignment of the two webs 16 to the opening formed by the two recesses 3 can be seen. Thus, the distance of the inner edges of the two webs 16 is smaller than the diameter of the opening. The still opened device can be fixed to a cable by means of the two webs. The cable is clamped between the two webs 16. The webs 16 can also give way thereto or yield to a certain extent.

FIG. 11 shows a view of the closed housing from the top in FIG. 7. In this case, the two openings 23 for the tool to unlock the housing are also visible.

The invention claimed is:

1. A device for absorption of electrical noise, having
a housing,
which comprises two housing half-shells (1, 2) for receiving in each case one element (7) made of a noise-preventing material, and
in the closed state in both end face walls thereof in each case one passage opening (3, 3) for one or multiple cables,
in each housing half-shell (1, 2) an element (7) made of the noise-preventing material which
comprises in each case a semi-cylindrical groove (8) forming an essentially closed cylindrical passage for at least one cable in the assembled state of the housing,
as well as having a locking device which
is operative inside the wall of the half-shell (1) to transition from an unlocked position, both positions being,
visible through an aperture (15) of the wall of at least one housing half-shell (1).

2. The device according to claim 1, wherein the locking device is configured such that it is actuated during closing of the housing by means of the closing procedure.

3. The device according to claim 1, having at least one snap protrusion (13) arranged on a longitudinal edge (12) of one housing half-shell (2) and a snap shoulder (24) arranged on the other housing half-shell (1), behind which shoulder the snap protrusion (13) engages in the correctly closed state of the housing.

4. The device according to claim 3, wherein the snap shoulder (24) is arranged in a depression (14) ending in the longitudinal edge (12) of the half-shell (1), which depression forms a guidance for the snap protrusion (13).

5. The device according to claim 1, wherein for insertion of a tool disengaging the locking device, the locking device comprises an opening (23) ending in the surface of one of the half-shells (1).

6. The device according to claim 1, wherein the locking device is operative on two locations spaced in the longitudinal direction of the housing.

7. The device according to claim 1 wherein the two housing half-shells (1, 2) are connected to one another on one of their longitudinal edges (5) by means of a film hinge (6).

8. The device according to claim 1, including a means for fixing a housing half-shell (2) to a cable guided through the housing even in the opened state of the housing.

9. The device according to claim 1, including a support for fixing a ferrite element (7) in the respective half-shell (1, 2).

10. The device according to claim 1, wherein the locking device is configured such that at least one of the parts (22, 24) forming the locking device performs a movement within the plane of the aperture (15) during transfer from the not locked position into the locking position.

* * * * *